US012762313B2

(12) United States Patent
Qian

(10) Patent No.: US 12,762,313 B2
(45) Date of Patent: Oct. 13, 2026

(54) SYSTEMS AND METHODS FOR AUTOMATIC PIN MATCHING BETWEEN FUNCTIONAL BLOCKS IN A LAYOUT VIA A GRAPHIC-BASED LAYOUT EDITOR

(71) Applicant: Skillcad, Inc., San Jose, CA (US)

(72) Inventor: Pengwei Qian, San Jose, CA (US)

(73) Assignee: Skillcad, Inc., San Jose, CA (US)

( * ) Notice: Subject to any disclaimer, the term of this patent is extended or adjusted under 35 U.S.C. 154(b) by 635 days.

(21) Appl. No.: 18/234,202

(22) Filed: Aug. 15, 2023

(65) Prior Publication Data

US 2024/0070358 A1 Feb. 29, 2024

Related U.S. Application Data

(60) Provisional application No. 63/402,302, filed on Aug. 30, 2022.

(51) Int. Cl.
*G06F 30/31* (2020.01)

(52) U.S. Cl.
CPC .................................... *G06F 30/31* (2020.01)

(58) Field of Classification Search
USPC .......................................................... 716/139
See application file for complete search history.

(56) References Cited

U.S. PATENT DOCUMENTS 9,361,415 B1 * 6/2016 Ginetti .................. G06F 30/327

* cited by examiner

*Primary Examiner* — Bryce M Aisaka

(57) ABSTRACT

An approach is proposed to support pin matching between different functional blocks in a circuit layout. A layout editing tool first presents functional blocks in the layout to a user and recognizes one or more user actions to identify a first boundary of a first/reference block and a second boundary of a second/target block among the functional blocks. The layout editing tool then identifies a first set of pins on the first boundary of the reference block and a second set of pins on the target block wherein each of the pins in the second set of pins belongs to a same net as at least one of the pins in the first set of pins. The second set of pins are sorted to be in the same order as the first set of pins based on their net ids and placed on the second boundary of the target block.

18 Claims, 7 Drawing Sheets

SYSTEMS AND METHODS FOR AUTOMATIC PIN MATCHING BETWEEN FUNCTIONAL BLOCKS IN A LAYOUT VIA A GRAPHIC-BASED LAYOUT EDITOR

CROSS-REFERENCE TO RELATED APPLICATIONS

This application claims the benefit of U.S. Provisional Patent Application No. 63/402,302, filed Aug. 30, 2022, which is incorporated herein in its entirety by reference.

BACKGROUND

A graphic-based layout editing tool/editor is software running on a hosting device or host, wherein the graphic-based layout editor presents a layout of a circuitry, such as an integrated circuit (IC) design to a user/IC designer on a display screen. The graphic-based layout editor enables the user to interactively generate and edit the layout of the IC via one or more input devices. Typically, the layout of the IC includes hundreds or even thousands of layout objects of various shapes and sizes, including but not limited to functional blocks (or blocks/modules/cells) and nets of interconnect wires connecting the functional blocks. Each of the functional blocks comprises a plurality (e.g., many thousands) of gates and transistors to perform certain functions of the IC. Each of the functional blocks occupies a placement and routing (PR) region in a layout as defined by a set of PR boundaries (or boundaries), within which each functional block should be placed and its interconnect wires be routed. Each of the functional blocks also includes a plurality of pins on one or more PR boundaries of the functional block. Here, a pin is considered to be on a PR boundary if the shape of the pin is touching or crossing the PR boundary. The plurality of pins are configured to transmit input and/or output signals into and/out of each functional block, wherein each pin belongs to a net having a plurality of pins assigned to different functional blocks. The pins of each net are connected together via interconnect wires to carry the same input and/or output signals among the functional blocks.

Under certain scenarios, each of a set of pins on one functional block need to be connected to one pin from another set of pins on another functional block via the interconnect wires, wherein the two pins belong to the same net. For a non-limiting example, a set of pins (pin_1*a*, pin_2*a*, pin_3*a*) located on a block block_a needs to be connected to another set of pins (pin_1*b*, pin_2*b*, and pin_3*b*) located on another block block_b, wherein pin_1*a* and pin_1*b* both belong to the same net_1, pin_2*a* and pin_2*b* both belong to the same net_2, and pin_3*a* and pin_3*b* both belong to the same net_3, wherein each pair of pins needs to be connected. For routing efficiency, e.g., shorter interconnect wires, it is desirable to have the two set of pins aligned and positioned in the same order by their net ids/names/numbers. on both blocks, e.g., the two sets of pins (pin_1*a*, pin_2*a*, pin_3*a*) and (pin_1*b*, pin_2*b*, and pin_3*b*) should be positioned on both block_a and block_b, respectively, in the same (1, 2, 3) order. However, identifying the two sets of pins that should be connected together and sorting them in the same order manually is often cumbersome and time consuming.

The foregoing examples of the related art and limitations related therewith are intended to be illustrative and not exclusive. Other limitations of the related art will become apparent upon a reading of the specification and a study of the drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF EMBODIMENTS

Figure 1:
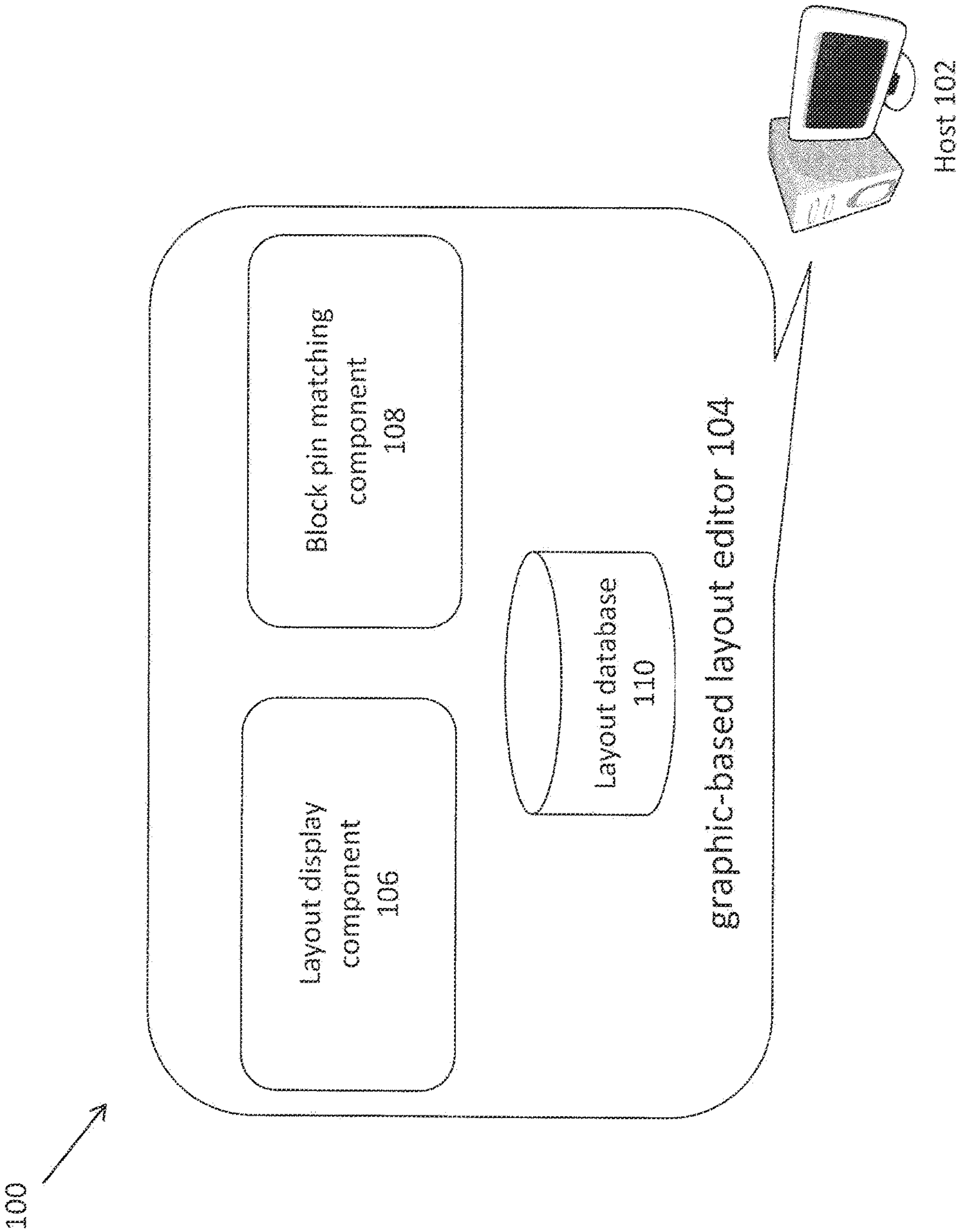
FIG. 1 depicts an example of a diagram of a system to support block pin matching in circuit layout in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A new approach is proposed that contemplates systems and methods to support pin matching between different functional blocks in a circuit layout via a graphic-based layout editing tool running on a host. The graphic-based layout editing tool first presents a plurality of functional blocks in the layout on a display to a user and recognizes one or more actions by the user to identify a first boundary of a first/reference block and a second boundary of a second/target block among the plurality of functional blocks in the layout. The graphic-based layout editing tool then identifies a first set of pins on the first boundary of the reference block and a second set of pins on the target block wherein each of the pins in the second set of pins belongs to a same net as at least one of the pins in the first set of pins on the reference block. The graphic-based layout editing tool sorts the second set of pins on the target block to be in the same order as the first set of pins on the reference block based on their net ids and places the sorted second set of pins on the identified second boundary of the target block. Once the second set of pins has been placed, the graphic-based layout editing tool is optionally configured to connect each pin in the first set of pins with a pin in the second set of pins that belongs to the same net via one or more interconnect wires.

Under the proposed approach, the graphic-based layout editing tool enables the user to match and connect two sets of pins on a reference block and a target block, respectively, by simply identifying the respective boundaries of the two blocks via an input device. Once the two boundaries have been identified, the identification, sorting, placement, and connection of the set of matching pins on the target block are performed automatically by the graphic-based layout editing tool. As such, the proposed graphic-based layout editing tool performs pin matching between the functional blocks in one single operation with no user intervention needed.

FIG. 1 depicts an example of a diagram of a system 100 to support block pin matching in circuit layout. Although the diagrams depict components as functionally separate, such depiction is merely for illustrative purposes. It will be apparent that the components portrayed in this figure can be arbitrarily combined or divided into separate software, firmware and/or hardware components. Furthermore, it will also be apparent that such components, regardless of how they are combined or divided, can execute on the same host or multiple hosts, wherein the multiple hosts can be connected by one or more networks.

In the example of FIG. 1, the system 100 includes a graphic-based layout editor/editing tool/editing software 104, wherein the graphic-based layout editor 104 includes at least a layout display component 106, a block pin matching component 108, and a layout database 110. Here, the graphic-based layout editor 104 runs on a computing unit/appliance/host 102 having a display, one or more processors, storage units, network interfaces and having software instructions stored in a storage unit, such as a non-volatile memory (also referred to as secondary memory) of the computing unit for practicing one or more processes. When the software instructions are executed, at least a subset of the software instructions is loaded into memory (also referred to as primary memory) by one of the computing units, which becomes a special purposed one for practicing the processes. The processes may also be at least partially embodied in the host into which computer program code is loaded and/or executed, such that, the host becomes a special purpose computing unit for practicing the processes.

In the example of FIG. 1, the host 102 can be a computing device, a communication device, a storage device, or any computing device capable of running a software component. For non-limiting examples, a computing device can be, but is not limited to, a laptop PC, a desktop PC, a tablet PC, or an x86 or ARM-based server running Linux or other operating systems. In some embodiments, the host has a communication interface (not shown), which enables the components and/or the database running on the host to communicate with software running on other host over one or more communication networks (not shown) following certain communication protocols, such as TCP/IP, http, https, ftp, and sftp protocols. The communication networks can be, but are not limited to, internet, intranet, wide area network (WAN), local area network (LAN), wireless network, Bluetooth, WiFi, and mobile communication network. The physical connections of the network and the communication protocols are well known to those of skill in the art.

Figure 2:
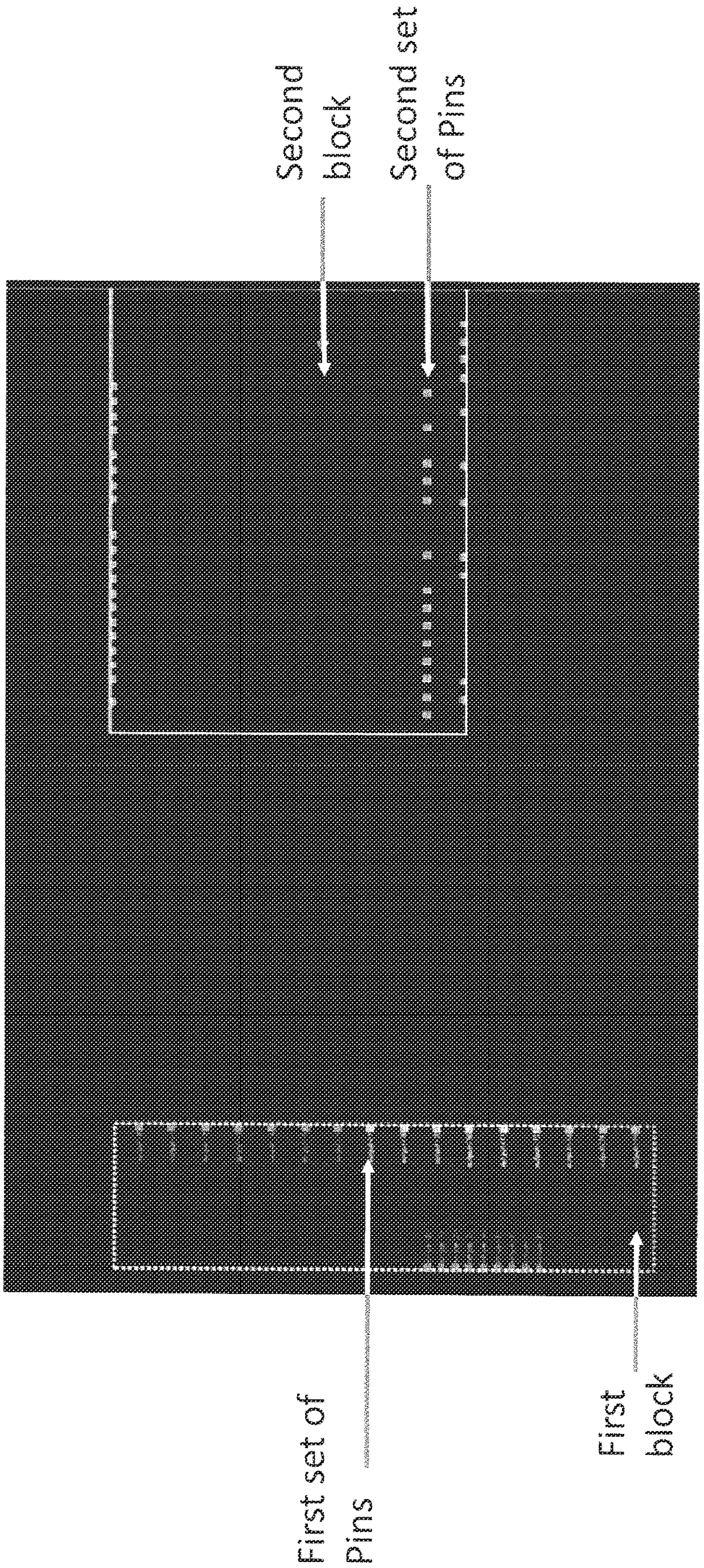
FIG. 2 depicts a non-limiting example of an IC layout having at least two blocks as shown via the layout display component of the graphic-based layout editor in accordance with some embodiments.

In the example of FIG. 1, the layout display component 106 of the graphic-based layout editor 104 is configured to retrieve a circuit layout having a plurality of layout objects, e.g., functional blocks, from the layout database 110 and present the circuit layout on a display device for a user to view and edit interactively. Here, the layout database 110 is configured to maintain metadata and/or design rules associated with each of the layout objects in the layout as well as other related information of the layout. For a non-limiting example, the layout database 110 is configured to maintain information of a set of pins assigned to each functional block, wherein such information includes but is not limited to, id, and input or output nature of each pin, location of each pin on a PR boundary of the block, the net each pin belongs to, etc. The metadata associated with each of the layout objects includes one or more of name, number, identifier or id, and geometric properties of the layout object as well as its connections to other layout objects. For a non-limiting example, each of the functional blocks is of certain geometric shape and size, e.g., a rectangle, and is located within a set of PR boundaries in the layout. Each PR boundary of the functional block may have a set of pins located on the PR boundary for transmitting signals in and/or out of the functional block, wherein each pin belongs to a net having a plurality of pins assigned to different functional blocks. FIG. 2 depicts a non-limiting example of an IC layout having at least two blocks, e.g., the first block and the second block, as shown via the layout display component 106 of the graphic-based layout editor 104. Each block has been assigned a set of pins, e.g., a first set of pins on the first block and a second set of pins on the second block, wherein the pins belonging to the same net are to be connected with interconnect wires. In some embodiments, the first set of pins has been placed on a PR boundary of the first block as shown in FIG. 2, while the second set of pins on the second block may not have been placed on a PR boundary yet.

Figure 3A:
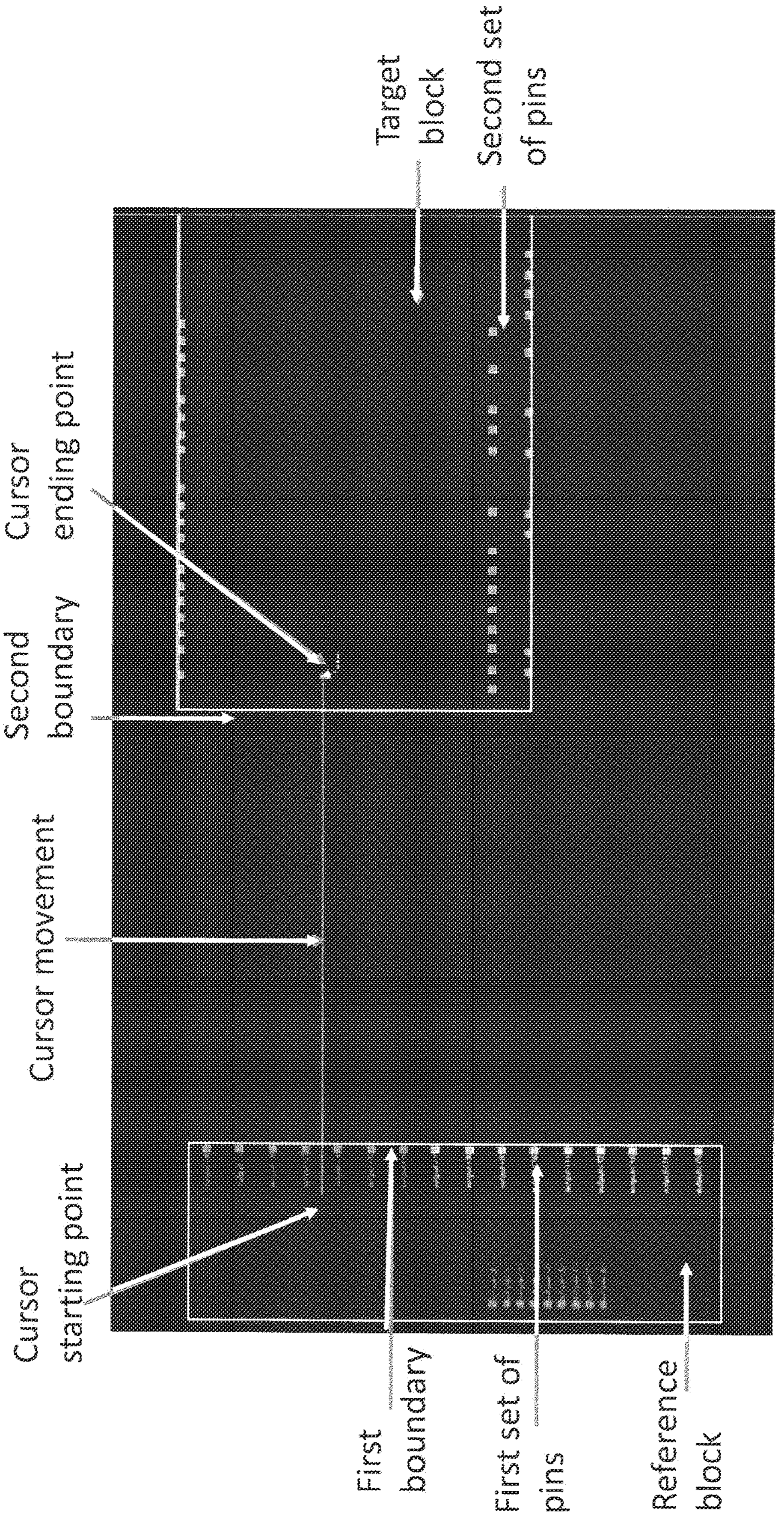
FIG. 3A depicts an example of a directional and continuous cursor movement along a directed single line from a starting point that identifies the reference block and the first boundary to an ending point that identifies the second boundary and the target block in accordance with some embodiments.
Figure 3B:
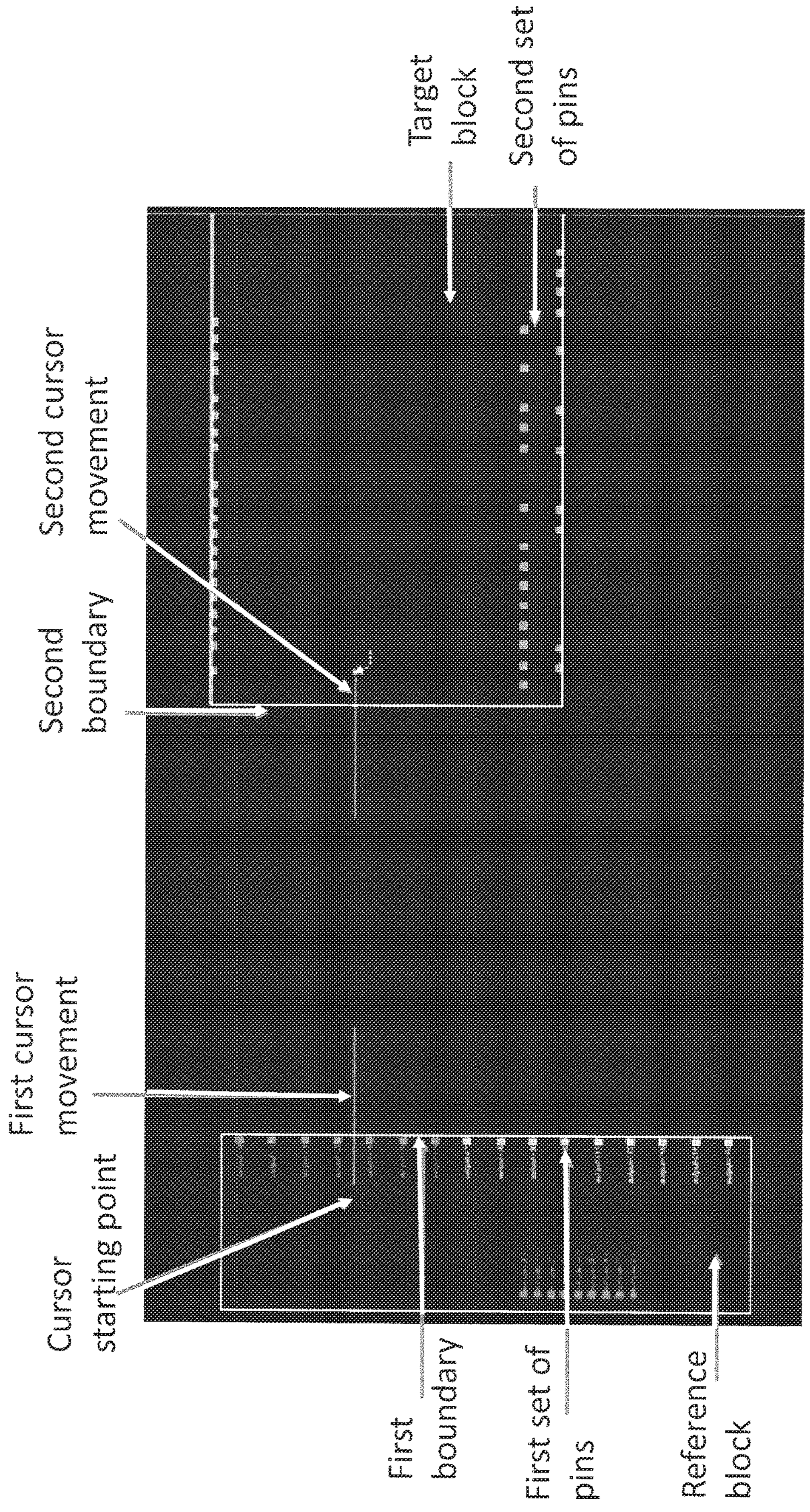
FIG. 3B depicts an example of two directional cursor movements, one identifies the reference block and the first boundary and another identifies the second boundary and the target block, in accordance with some embodiments.

In the example of FIG. 1, the block pin matching component 108 of the graphic-based layout editor 104 is configured to recognize an action initiated by a user, wherein such action identifies a first boundary of a first/reference block and/or a second boundary of a second/target block in the layout. In some embodiments, the user may initiate the action via an input device (e.g., a mouse) of the host 102 or by moving his/her finger across a touch screen of the host 102. In some embodiments, the action identifies the boundaries of the blocks by moving the cursor or finger to cross/intersect with the first and/or second boundary of the reference block and/or the target block. In some embodiments, the action is a directional, continuous cursor movement that crosses both the first boundary of the reference block and the second boundary of the target block in one movement in the form of one of a directed straight line, a directed curved line, or a directed line following a path of cursor movement across the layout. FIG. 3A depicts an example of a directional and continuous cursor movement along a directed single line from a starting point that identifies the reference block and the first boundary to an ending point that identifies the second boundary and the target block. In some embodiments, the action is two separate directional, continuous cursor movements, wherein a first cursor movement crosses the first boundary of the reference block and a second/separate cursor movement crosses the second boundary of the target block, respectively. Such multi-cursor movement is especially useful when a single line cursor movement between the reference and the target blocks is not possible (e.g., blocked by other blocks in between). FIG. 3B depicts an example of two directional cursor movements—one identifies the reference block and the first boundary and another identifies the second boundary and the target block.

Once the first boundary of the reference block has been identified, the block pin matching component 108 of the graphic-based layout editor 104 is configured to identify a first set of pins that have been assigned to and placed on the first boundary of the reference block. In some embodiments, the block pin matching component 108 is configured to retrieve information, assignment, and/or location the set of pins on each functional block from the layout database 110. The block pin matching component 108 is then configured to identify a set of pins that have been assigned to the target block, and to further identify a second set of pins among the set of pins on the target block, wherein each pin of the second set of pins belongs to the same net as at least one pin in the first set of pins on the reference block. Note that the second set of pins may not have been assigned to or placed on the second boundary of the target block yet as shown by the examples depicted in FIGS. 3A and 3B.

Figure 3C:
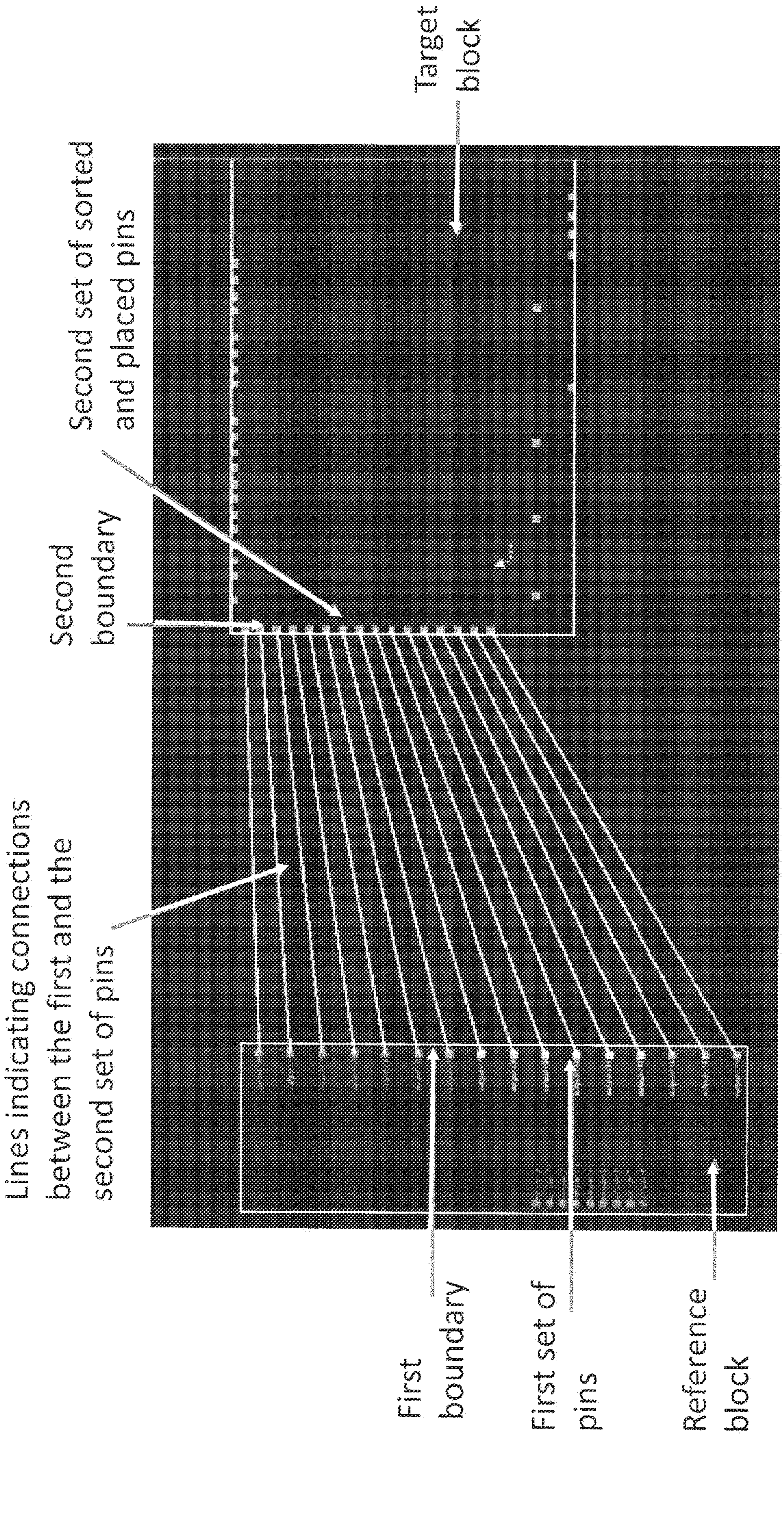
FIG. 3C depicts an example of placing and connecting the sorted second set of pins on the second boundary of the target block with the first set of pins located on the first boundary of the reference block in accordance with some embodiments.
Figure 4:
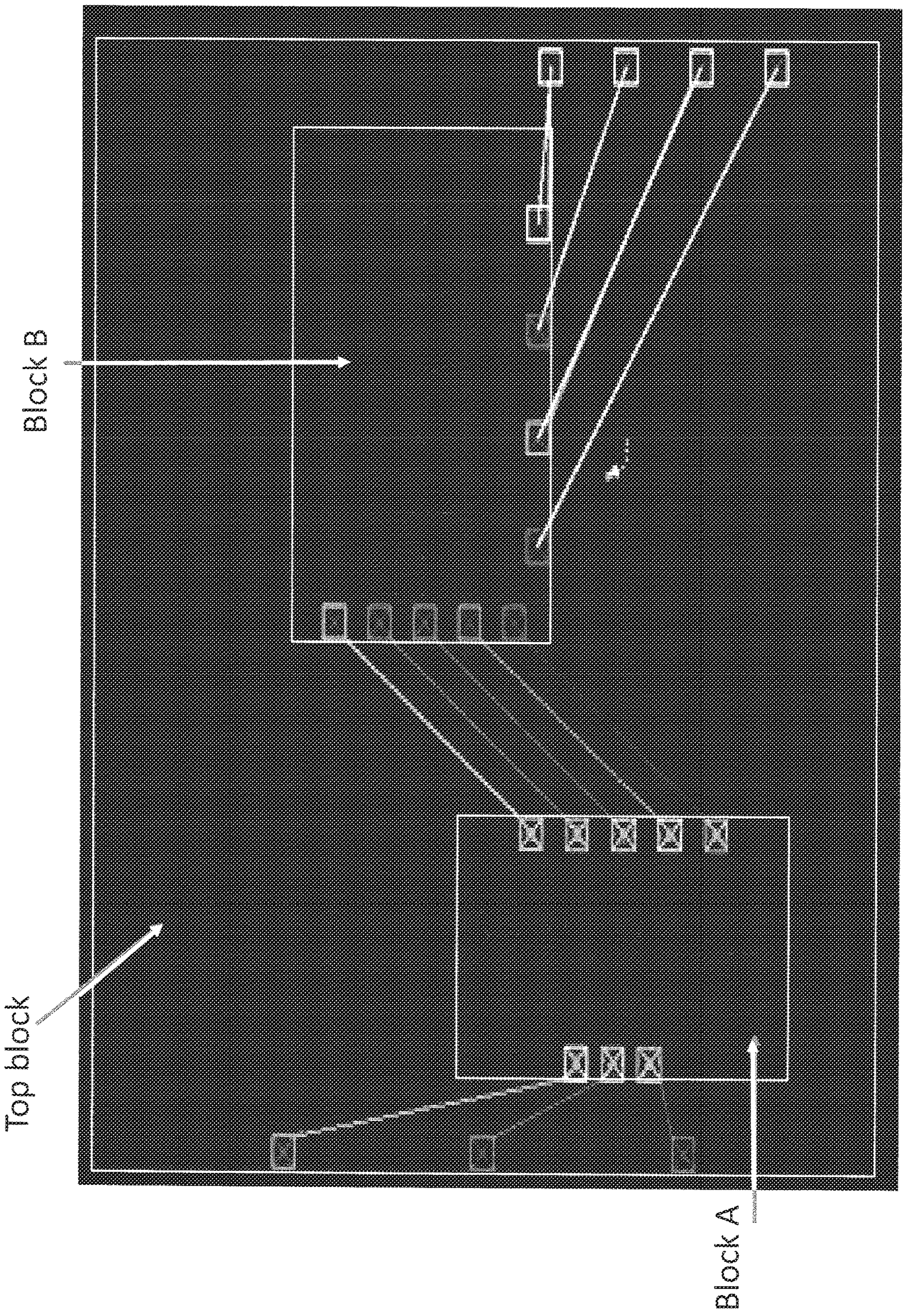
FIG. 4 depicts an example of a top level block having sets of pins that are identified, sorted, placed and connected with the corresponding sets of pins on Block A and Block B, respectively.

After the second set of pins that each shares at least one net with the first set of pins on the reference block has been identified, the block pin matching component 108 is configured to sort the second set of pins by their net ids/names/numbers in the same order as the net ids/names/numbers of the first set of pins that have been placed on the first boundary of the reference block. Once sorted, the second set of pins are placed on the identified second boundary of the target block in the same order as the first set of pins placed on the first boundary of the reference block Finally, in some embodiments, the sorted second set of pins placed on the second boundary of the target block are optionally connected with the first set of pins located on the first boundary of the reference block as indicated by the lines shown by the example of FIG. 3C (the actual interconnect wire segments routed to connect the pins are not shown). Since the two sets of pins have been sorted and placed in the same order, there is no intersection among the connections between each pair pins in the respective sets that belong to the same net as shown in FIG. 3C. In some embodiments, the pin matching approach discussed above can also be applied to the scenario where either the reference block or the target block is at the top level of the circuit layout, e.g., a top level circuit block that includes all other blocks in the layout. FIG. 4 depicts an example of a top level block having sets of pins that are identified, sorted, placed and connected with the corresponding sets of pins on Block A and Block B, respectively.

Once pin matching between the reference block and the target block has been completed, the layout display component 106 of the graphic-based layout editor 104 is configured to present the layout including the matched and placed sets of pins on both the reference block and the target block on the display for the user to review and edit. In some embodiments, the block pin matching component 108 is configured to update and save the updated layout of the plurality of blocks as well as the metadata, e.g., pin location information and the connections between the pins, of the plurality of blocks to the layout database 110.

Figure 5:
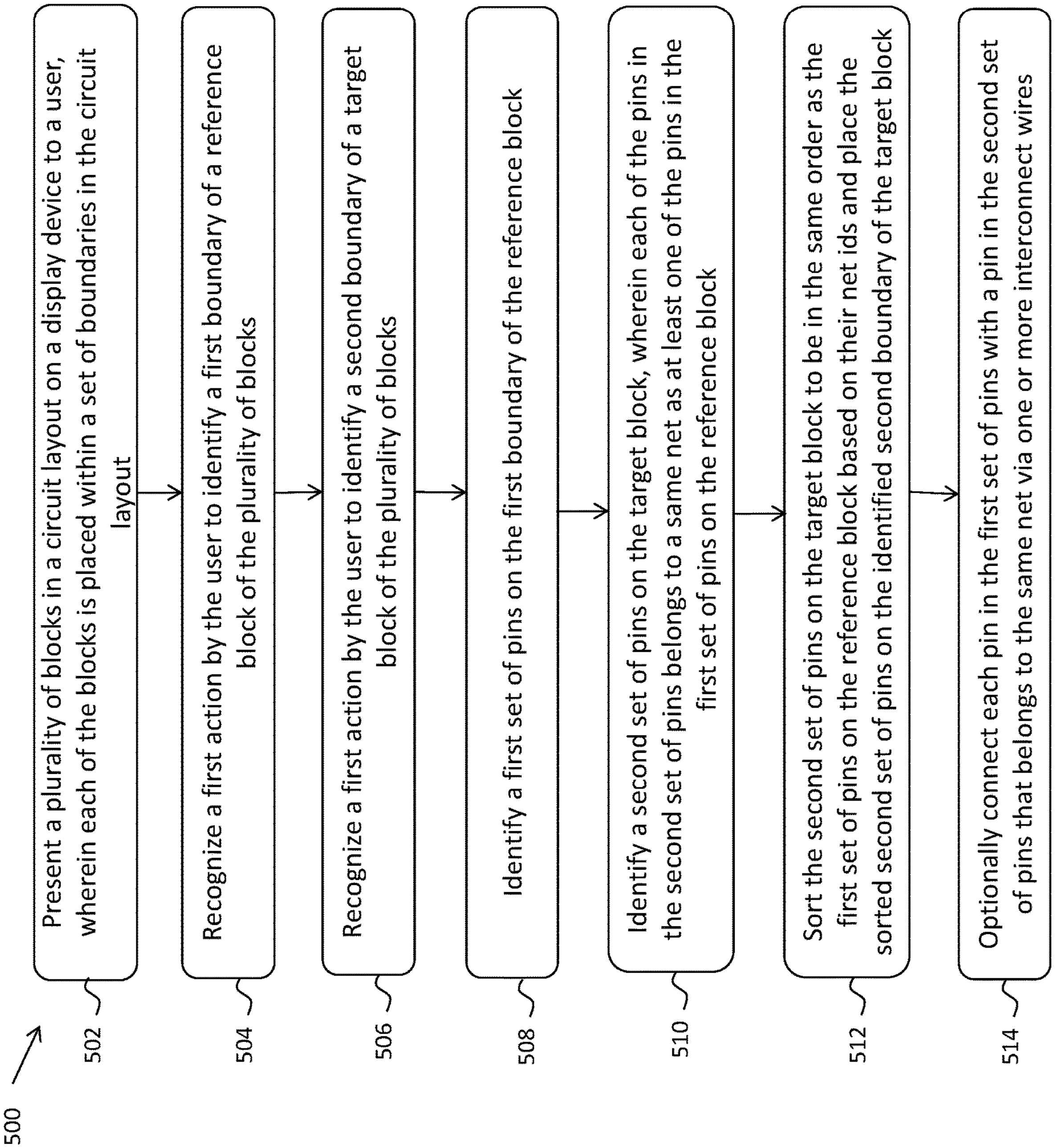
FIG. 5 depicts an example of a flowchart of a process to support block pin matching in circuit layout in accordance with some embodiments.

FIG. 5 depicts an example of a flowchart of a process to support block pin matching in circuit layout. Although this figure depicts functional steps in a particular order for purposes of illustration, the process is not limited to any particular order or arrangement of steps. One skilled in the relevant art will appreciate that the various steps portrayed in this figure could be omitted, rearranged, combined and/or adapted in various ways.

In the example of FIG. 5, the flowchart 500 starts at block 502, where a plurality of blocks in a layout is presented on a display device to a user, wherein each of the blocks is placed within a set of boundaries in the layout. The flowchart 500 continues to block 504, where a first action by the user is recognized to identify a first boundary of a reference block of the plurality of blocks. The flowchart 500 continues to block 506, where a second action by the user is recognized to identify a second boundary of a target block of the plurality of blocks. The flowchart 500 continues to block 508, where a first set of pins on the first boundary of the reference block is identified. The flowchart 500 continues to block 510, where a second set of pins on the target block is identified, wherein each of the pins in the second set of pins belongs to a same net as at least one of the pins in the first set of pins on the reference block. The flowchart 500 continues to block 512, where the second set of pins on the target block is sorted to be in the same order as the first set of pins on the reference block based on their net ids and placed on the identified second boundary of the target block. The flowchart 500 ends at block 514, where each pin in the first set of pins is optionally connected with a pin in the second set of pins that belongs to the same net via one or more interconnect wires.

One embodiment may be implemented using a conventional general purpose or a specialized digital computer or microprocessor(s) programmed according to the teachings of the present disclosure, as will be apparent to those skilled in the computer art. Appropriate software coding can readily be prepared by skilled programmers based on the teachings of the present disclosure, as will be apparent to those skilled in the software art. The invention may also be implemented by the preparation of integrated circuits or by interconnecting an appropriate network of conventional component circuits, as will be readily apparent to those skilled in the art.

One embodiment includes a computer program product which is a machine readable medium (media) having instructions stored thereon/in which can be used to program one or more hosts to perform any of the features presented herein. The machine readable medium can include, but is not limited to, one or more types of disks including floppy disks, optical discs, DVDs, CD-ROMs, micro drives, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data. Stored on any one of the computer's readable medium (media), the present invention includes software for controlling both the hardware of the general purpose/specialized computer or microprocessor, and for enabling the computer or microprocessor to interact with a human viewer or other mechanism utilizing the results of the present invention. Such software may include, but is not limited to, device drivers, operating systems, execution environments/containers, and applications.

The foregoing description of various embodiments of the claimed subject matter has been provided for the purposes of illustration and description. It is not intended to be exhaustive or to limit the claimed subject matter to the precise forms disclosed. Many modifications and variations will be apparent to a practitioner skilled in the art. Particularly, while the concept "component" is used in the embodiments of the systems and methods described above, it will be evident that such concept can be interchangeably used with equivalent concepts, such as class, method, type, interface, module, object model, and other suitable concepts. Embodiments were chosen and described in order to best describe the principles of the invention and its practical application, thereby enabling others skilled in the relevant art to understand the claimed subject matter, the various embodiments, and the various modifications that are suited to the particular use contemplated.

What is claimed is:

1. A system to support automatic pin matching in a circuit layout, comprising:

a graphic-based layout editing tool running on a host, which in operation, is configured to present a plurality of blocks in the circuit layout on a display device to a user, wherein each of the blocks is placed within a set of boundaries in the circuit layout;

recognize a first action by the user to identify a first boundary of a reference block of the plurality of blocks; recognize a second action by the user to identify a second boundary of a target block of the plurality of blocks;

identify a first set of pins on the first boundary of the reference block;

identify a second set of pins on the target block, wherein each of the pins in the second set of pins belongs to a same net as at least one of the pins in the first set of pins on the reference block;

sort the second set of pins on the target block to be in the same order as the first set of pins on the reference block based on their net ids; and place the sorted second set of pins on the identified second boundary of the target block, wherein the graphic-based layout editing tool is configured to connect each pin in the first set of pins with a pin in the second set of pins that belongs to the same net via one or more interconnect wires.

2. The system of claim 1, further comprising:

a layout database configured to maintain metadata associated with each of the plurality of blocks in the circuit layout.

3. The system of claim 2, wherein:

the metadata associated with each of the plurality of blocks includes one or more of name, number, identifier or id, and geometric properties of the layout object as well as its connections to other blocks.

4. The system of claim 2, wherein:

the graphic-based layout editing tool is configured to update and save the an updated layout of the plurality of blocks as well as the metadata of the plurality of blocks to the layout database.

5. The system of claim 1, wherein:

one of the reference block and the target block is at a top level of the circuit layout.

6. The system of claim 1, wherein:

the first and/or the second action is initiated by the user via an input device of the host or by moving his/her finger across a touch screen of the host.

7. The system of claim 6, wherein:

the first and the second action are one directional, continuous cursor movement that crosses the first boundary of the reference block and/or the second boundary of the target block in one movement in the form of one of a directed straight line, a directed curved line, or a directed line following a path of cursor movement across the layout.

8. The system of claim 6, wherein:

the first and the second actions are two separate directional, continuous cursor movements, wherein a first cursor movement crosses the first boundary of the reference block and a second/separate cursor movement crosses the second boundary of the target block, respectively.

9. The system of claim 1, wherein:

the graphic-based layout editing tool is configured to present the matched and placed sets of pins on both the reference block and the target block for the user to review and edit.

10. A computer-implemented method to support automatic pin matching in a circuit layout, comprising:

presenting a plurality of blocks in the circuit layout on a display device to a user, wherein each of the blocks is placed within a set of boundaries in the circuit layout;

recognizing a first action by the user to identify a first boundary of a reference block of the plurality of blocks;

recognizing a second action by the user to identify a second boundary of a target block of the plurality of blocks;

identifying a first set of pins on the first boundary of the reference block;

identifying a second set of pins on the target block, wherein each of the pins in the second set of pins belongs to a same net as at least one of the pins in the first set of pins on the reference block;

sorting the second set of pins on the target block to be in the same order as the first set of pins on the reference block based on their net ids;

placing the sorted second set of pins on the identified second boundary of the target block; and connecting each pin in the first set of pins with a pin in the second set of pins that belongs to the same net via one or more interconnect wires.

11. The computer-implemented method of claim 10, further comprising:

maintaining metadata associated with each of the plurality of blocks in the circuit layout in a layout database, wherein the metadata associated with each of the plurality of blocks includes one or more of name, number, identifier or id, and geometric properties of the layout object as well as its connections to other blocks.

12. The computer-implemented method of claim 11, further comprising:

updating and saving an updated layout of the plurality of blocks as well as the metadata of the plurality of blocks to the layout database.

13. The computer-implemented method of claim 10, wherein:

one of the reference block and the target block is at a top level of the circuit layout.

14. The computer-implemented method of claim 10, wherein:

the first and/or the second action is initiated by the user via an input device of the host or by moving his/her finger across a touch screen of the host.

15. The computer-implemented method of claim 14, wherein:

the first and the second action are one directional, continuous cursor movement that crosses the first boundary of the reference block and/or the second boundary of the target block in one movement in the form of one of a directed straight line, a directed curved line, or a directed line following a path of cursor movement across the layout.

16. The computer-implemented method of claim 14, wherein:

the first and the second actions are two separate directional, continuous cursor movements, wherein a first cursor movement crosses the first boundary of the reference block and a second/separate cursor movement crosses the second boundary of the target block, respectively.

17. The computer-implemented method of claim 10, further comprising:

presenting the matched and placed sets of pins on both the reference block and the target block for the user to review and edit.

18. A non-transitory computer readable storage medium having software instructions stored thereon that when executed cause a system to:

present a plurality of blocks in the circuit layout on a display device to a user, wherein each of the blocks is placed within a set of boundaries in the circuit layout;

recognize a first action by the user to identify a first boundary of a reference block of the plurality of blocks;

recognize a second action by the user to identify a second boundary of a target block of the plurality of blocks;

identify a first set of pins on the first boundary of the reference block;

identify a second set of pins on the target block, wherein each of the pins in the second set of pins belongs to a same net as at least one of the pins in the first set of pins on the reference block;

sort the second set of pins on the target block to be in the same order as the first set of pins on the reference block based on their net ids;

place the sorted second set of pins on the identified second boundary of the target block; and connect each pin in the first set of pins with a pin in the second set of pins that belongs to the same net via one or more interconnect wires.

* * * * *